(12) United States Patent
Eilken et al.

(10) Patent No.: US 6,445,252 B1
(45) Date of Patent: Sep. 3, 2002

(54) DIGITAL PHASE LOCKED LOOP FOR DIFFERENT FREQUENCY BANDS

(75) Inventors: Jens Peter Eilken, Munich; Harry Siebert, Germering, both of (DE)

(73) Assignee: Siemens Aktiengesellscaft, Munich (DE)

( * ) Notice: Subject to any disclaimer, the term of this patent is extended or adjusted under 35 U.S.C. 154(b) by 0 days.

(21) Appl. No.: 09/670,165

(22) Filed: Sep. 26, 2000

(30) Foreign Application Priority Data

Sep. 29, 1999 (DE) .......................... 199 46 764

(51) Int. Cl.[7] .......................... H03L 7/087; H03L 7/099; H03L 7/18

(52) U.S. Cl. .......................... 331/34; 331/10; 331/11; 331/16; 331/17; 331/25; 331/179; 327/156; 375/376; 455/260

(58) Field of Search .......................... 331/1 A, 10, 14, 331/16–18, 25, 34, 57, 179, 11; 327/156–159; 375/376; 455/260; 360/51

(56) References Cited

U.S. PATENT DOCUMENTS

| 5,075,640 A | 12/1991 | Miyazawa |
| 5,257,294 A | 10/1993 | Pinto et al. |
| 5,394,116 A * | 2/1995 | Kasturia ....................... 331/34 |
| 5,617,454 A | 4/1997 | Götz et al. |
| 5,687,202 A | 11/1997 | Eitrheim |
| 5,731,743 A | 3/1998 | Sauer |
| 5,923,715 A | 7/1999 | Ono |
| 6,177,844 B1 * | 1/2001 | Sung et al. .................... 331/25 |
| 6,194,971 B1 * | 2/2001 | Glen et al. ..................... 331/57 |

FOREIGN PATENT DOCUMENTS

| DE | 40 39 849 | 6/1992 |
| DE | 43 42 266 | 10/1996 |
| EP | 0 528 283 | 2/1993 |

* cited by examiner

Primary Examiner—David Mis
(74) Attorney, Agent, or Firm—Bell, Boyd & Lloyd LLC

(57) ABSTRACT

For controlling frequency and phase of an output clock signal dependent on a reference signal, a digital phase locked loop comprises a ring oscillator connected to a switch-over unit for generating the output clock signal. The ring oscillator has a plurality of serially arranged delay units. A phase comparator for comparing the phase of the reference signal and of the output clock signal. At least one switchable frequency divider unit is provided between the phase comparator and the output clock signal. A control unit controls the ring oscillator frequency by cut-in or cut-outs of delay units with the assistance of the switchover unit.

13 Claims, 3 Drawing Sheets

DIGITAL PHASE LOCKED LOOP FOR DIFFERENT FREQUENCY BANDS

BACKGROUND OF THE INVENTION

The invention is directed to a digital phase locked loop for controlling frequency and phase of an output clock signal dependent on a reference signal.

Current and future digital communication networks are largely transparent in view of the data transmission rates that are employed and also enable the use of different transmission methods or transmission protocols for the transmission of digital information—for example, synchronous digital hierarchy (SDH), plesiochronic digital hierarchy (PDH) and gigabit Ethernet. In such digital communication networks, it is necessary to provide devices for data regeneration or for restoring the amplitude, signal edge and clock of the communicated, digital data stream.

Digital phase locked loops are known for this purpose, these being utilized for clock recovery or for generating a clock signal from the transmitted, digital data stream. Such digital phase locked loops usually comprise analog or digital voltage-controlled oscillators for generating an output clock signal, digital frequency dividers and phase or frequency discriminators for comparing the output clock signal to an external reference signal. The function of such digital phase locked loops for recovering the clock from a digital data stream is adequately known to a person skilled in the art, so that their functioning shall not be discussed in greater detail.

Further, it is particularly required for digital signal multiplex devices within digital communication networks to support a plurality of different transmission methods or different transmission protocols—for example, synchronous digital hierarchy (SDH) and plesiochronic digital hierarchy (PDH) —,i.e. to be able to recover the data from the transmitted, digital data stream regardless of the transmission protocol or the transmission rate with which the data were transmitted. Interfaces that support both the SDH protocol with a transmission rate of 155.52 MHz as well as the PDH protocol with a lower transmission rate of 139.149 MHz or can be operated in the SDH or PDH mode must therefore be provided on such digital signal multiplex devices. For this purpose, such switchable interface modules usually comprise at least two analog, PLLs, whereby the one PLL is operated in the SDH mode and the other PLL is operated in the PDH mode, and switching between the two PLLs is undertaken dependent on the incoming digital data or, respectively, the data stream.

For clock recovery of different demultiplexed channels of the digital data stream, additionally a clock signal that matches the data of the respective demultiplexed channel must be recovered. Thus, the transmission rate or the gap timing signal of the different channels recovered by demultiplexing the incoming digital data stream can deviate slightly from the transmission rate or from the transmission clock of the communication system, or the recovered clock signal can exhibit phase fluctuations (jitter). The data separated according to channels together with their gap timing signal are read into a buffer memory and are intermediately stored before further transmission to the communication system. For reading out the data separated according to channels, a digital phase locked loop PLL is respectively utilized per channel for generating a stable and low-jitter clock signal. For this purpose, additional high-quality phase locked loops are needed due to the demand made of the jitter attenuation.

SUMMARY OF THE INVENTION

An object of the invention is to specify a digital phase locked loop for different frequency bands respectively having a plurality of selectable phases. Proceeding from a digital phase locked loop, this object is achieved wherein a digital phase locked loop is provided for controlling frequency and phase of an output clock signal dependent on a reference signal. A ring oscillator is provided for generating the output clock signal and is formed of a switchover unit and of a plurality of serially arranged delay units. A phase comparator compares a phase of the reference signal and of the output clock signal. At least one switchable frequency divider unit is provided. A control unit controls a frequency of the ring oscillator by cut-in or cut-out of delay units with assistance of a switchover unit.

This object is achieved by a digital phase locked loop for controlling frequency and phase of an output clock signal dependent on a reference signal that comprises a ring oscillator for generating the output clock signal that is formed of a switchover unit and a plurality of serially arranged delay units and comprises a phase comparator for comparing the phase of the reference signal and the output clock signal. Further, the digital phase locked loop comprises at least one switchable frequency divider unit and a control unit for regulating the ring oscillator frequency by activating or deactivating delay units with the assistance of the switchover unit. As a result thereof, a ring oscillator is especially advantageously realized digitally with the assistance of a plurality of delay units, whereby the outputs of the delay units are connected to the inputs of the switchover unit, i.e. the return of the ring oscillator is switchable. As a result of the cut-in or cut-out of one or more delay units, the ring oscillator frequency can be individually regulated with the assistance of the switchover unit and of the control unit. Given a fixed plurality of serially connected delay units of the ring oscillator, output clock signals respectively comprising the same frequency advantageously pend at the outputs of the delay units, whereby these output clock signals exhibit different phase positions. All phase positions of the output clock signal can thus be taken at the respective outputs of the delay units with the assistance of the switchover unit. The digital phase locked loop can be realized cost-beneficially and in resource-saving fashion in a purely digital way, for example in an ASIC (application-specific integrated circuit), as a result whereof the provision of an external oscillator is eliminated. The "layouting" of the electronic circuit is thus particularly advantageously simplified as a result of the low number of electronic components, the noise emission is reduced, and a higher packing density of the individual interfaces per module is enabled.

A further critical advantage of the invention is that a further switchover unit is provided for generating a recovered output clock signal with slightly different phase position and frequency compared to the output clock signal. This is accomplished by continuously cyclically taking the signals respectively comprising a different phase present at the outputs of the delay units of the ring oscillator. Advantageously, a recovered output clock signal wit h slightly different phase and frequency compared to the output clock signal is inventively acquired by a further switchover unit. For example, the buffer memory of an input interface module of a digital multiplexer is written or read with the assistance of this recovered, stable and low-jitter output clock signal. As a result of the provision according to the invention of a further switchover unit of, for example a digitally realized multiplexer, the output clock signals of a plurality of channels that exhibit a different frequency offset with respect to the reference signal can be recovered and used for the readout of the respective buffer memory. As a result of the inventive combination of a multiplexer and a digital ring oscillator, the plurality of phase locked loops needed for the clock recovery of the individual transmission channels is reduced to nearly a single digital phase locked loop that comprises a plurality of inventive "outfeed units" or switchover units. Additionally, the generation of the output clock signal and the clock recovery of a recovered output clock signal exhibiting a slight frequency difference with respect to the output clock signal is decoupled.

According to a further development of the invention, at least one phase comparator an d at least one switchable frequency divider unit inserted between the ring oscillator and the phase comparator are provided, so that output clock signals can be generated with different frequencies. With the assistance of the switchable frequency divider unit, it is advantageously possible to generate frequencies within the frequency interval defined by two neighboring delay units. This is accomplished by a cyclical switching in a defined relationship between the signal at the output of the one delay unit and the signal at the output of the neighboring delay unit. By regularly taking the signals at the outputs of neighboring delay units and respectively exhibiting a different phase, output clock signals having intermediate frequencies between the characteristic frequencies of the ring oscillator can be generated. Thus selection of the signal to be taken is implemented according to the criterion of the "Bresenham" algorithm known from computer graphics.

Another critical advantage of the phase locked loop of the invention is that the frequency divider unit comprises a first and a second divider counter. The counter reading of the first divider counter determines the number of clock periods for an output clock signal exhibiting a first frequency. The counter reading of the second divider counter determines the number of corresponding clock periods for an output clock signal exhibiting a second, neighboring frequency. An output clock signal having a frequency lying between a first and a second, neighboring frequency can be generated on the basis of the counter readings of the first and second divider counters. Advantageously, output clock signals having a frequency that lies between the frequencies of the output clock signals that can be taken from the ring oscillator can also be generated with the assistance of the first and second divider counter provided in the frequency divider unit.

According to a further development of the invention, a first and a second counter are provided. The first counter is started with a first, whole-number start value N1 and the second counter is started with a second whole-number start value N2 by a signal edge of the reference signal. The ratio of the first to the second start value N1/N2 is determined by the required relationship of the output clock signal to the reference signal. Based on the sequence of the run-down of the first and second counters, a first control signal is generated by the switch-over unit for the cut-in or cut-out of delay units within the ring oscillator. By employing first and second counters which, for example, are started with the leading edge of the reference signal, the frequency of the output clock signal is advantageously approximated to the frequency of the reference signal. Thus a further delay unit is cut-in or cut-out by the switchover unit with the assistance of the first control signal generated by the control unit and dependent on which counter ran down first. This approximation is implemented until the divided ring oscillator frequency coincides with the divided frequency of the reference signal except for a slight frequency difference.

According to a further development of the invention, a third and fourth circular counter are provided. The third circular counter is started with a third, whole-number start value N3 and the fourth circular counter is started with a fourth whole-number start value N4 by a signal edge of the reference signal. The counter reading of the third counter is reduced by a count unit with a respective clock edge of the divided reference signal. The counter reading of the fourth counter is respectively reduced by a count unit with a clock edge of the divided output clock signal. Further, the ratio of the third and fourth start value N3/N4 is defined by the required relationship of the reference signal to the output clock signal. The counter reading of the third and fourth circular counter are compared at a zero-axis crossing of the third or fourth counter. The counter reading of the first and/or second divider counter is incremented or deincremented on the basis of the comparison result. As a result thereof, a "fine control" of the output signal can be especially advantageously realized in view of the reference signal, whereby the "fine control" of the digital phase locked loop is implemented nearly uninterrupted in the steady state.

A further aspect of the invention is that the further switch-over unit respectively through-connects a recovered output signal with a defined clock phase and frequency with the assistance of a second control signal generated by the control unit, and the second control signal is represented by a register value. Further, the register value is formed by a synchronous counter clocked by the reference signal and, for raising or lowering the clock phase and frequency of the recovered output clock signal, the synchronous counter is incremented or deincremented by respective, predetermined whole-number value. The predetermined, whole-number increment value is thus provided for offset formation between reference signal and recovered output clock signal. As a result thereof, output clock signals that exhibits a fixed or adjustable offset with respect to the reference signal can be generated in an especially simple way. For example, the data upon readout of a buffer memory of an input unit of a transmission system must be readout with nearly the same clock with which they were read into the buffer memory. The regeneration of such a clock from the incoming data stream or, respectively, data signals is substantially simplified by the application of the invention due to the different phase positions of the output clock signal already present in the ring oscillator, i.e. the inventive regeneration can be realized without substantial, circuit-oriented outlay, particularly without providing an additional, analog oscillator.

The invention is explained in detail below on the basis of preferred exemplary embodiments with reference to the drawing figures.

DESCRIPTION OF THE PREFERRED EMBODIMENTS

Figure 1:
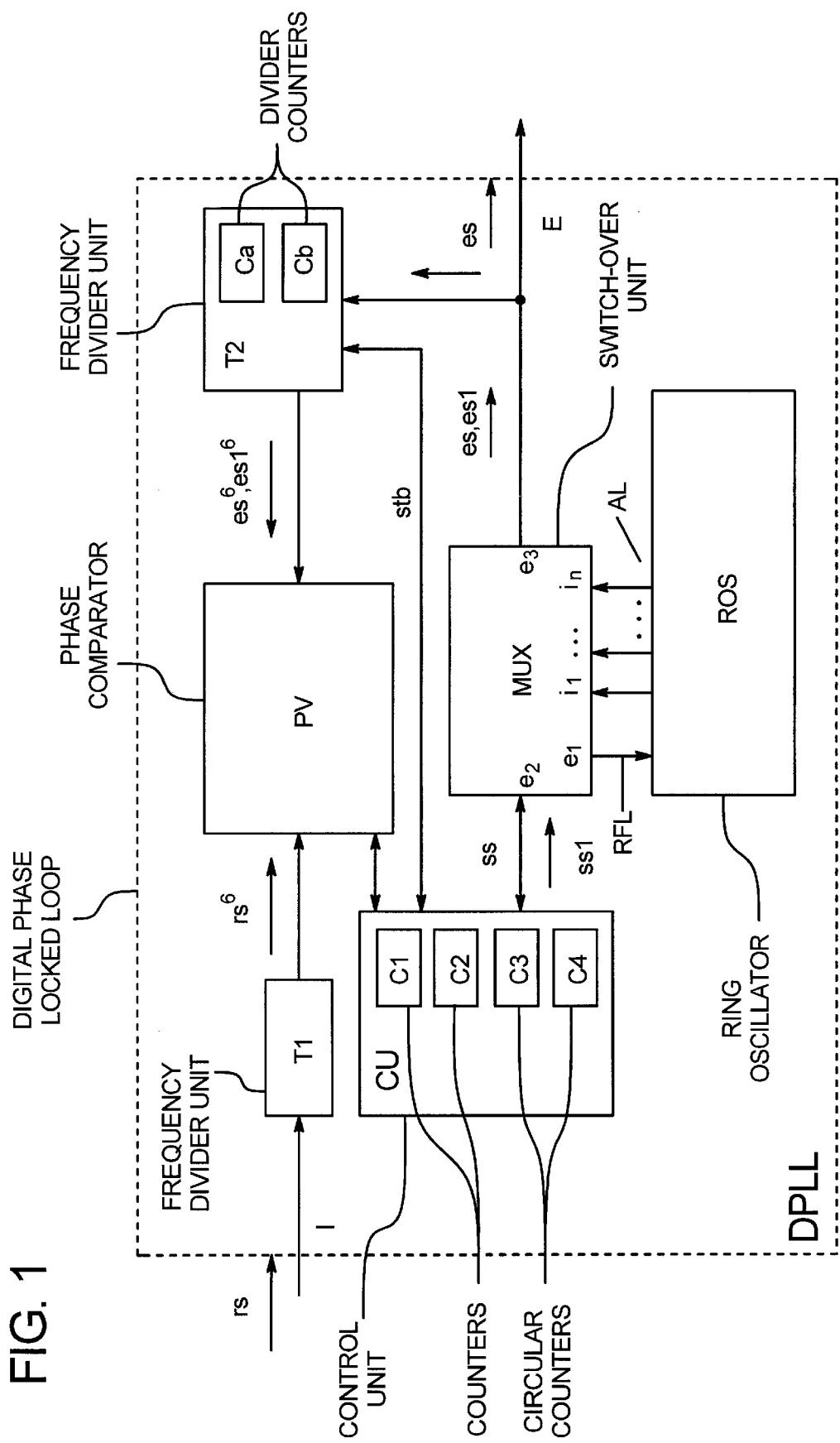
FIG. 1 shows a block circuit diagram of a first exemplary embodiment of the digital phase locked loop of the invention.

FIG. 1 shows a block circuit diagram of an inventive digital phase locked loop DPLL that comprises a first and a second switchable frequency divider unit T1, T2, a phase comparator PV, a control unit CU, a switchover unit MUX and a ring oscillator ROS, whereby the switchover unit MUX comprises, for example, a plurality of inputs $i_1$ through $i_n$ and a first, second and third output $e_1$ through $e_3$. The first and second switchable frequency divider unit T1, T2 is respectively connected to the phase comparator PV. Further, the second switchable frequency divider unit T2 comprises a first and second divider counter ca, cb and is connected to the control unit CU and to the switchover unit MUX to which the ring oscillator ROS is connected via a plurality of connecting lines AL and a return line RFL. The switchover unit MUX is connected to the control unit CU, whereby the control unit CU is additionally connected to the phase comparator PV. Further, the control unit CU comprises a first and second counters C1, C2 as well as a third and fourth circular counters C3, C4.

A reference signal rs that is transmitted to the first frequency divider unit T1 is present at the input of the digital phase locked loop DPLL. With the assistance of the first frequency divider unit T1, the frequency of the reference signal rs is reduced and, thus, the reference signal rs is adapted to the operating frequency range of the phase comparator PV. Subsequently, the divided reference signal rs' is communicated to the phase comparator PV. Further, an output clock signal yes generated by the ring oscillator ROS is transmitted via the switchover unit MUX that, for example, is realized as a multiplexer, being transmitted to the second switchable frequency divider unit T2. The frequency of the output clock signal yes is divided by the second switchable frequency divider unit T2 for adaptation to the operating frequency range of the phase comparator PV, and the divided output clock signal es' is forwarded to the phase comparator PV. The division ratio of the second switchable frequency divider unit T2 is controlled by the control unit CU with the assistance of division control commands stb on the basis of the counter readings of the third and fourth counters C3, C4.

The divided reference signals rs' and the divided output clock signal es' are compared in view of their frequency and phase position in the phase comparator PV. The first and second counters C1, C2 are provided for determining a frequency difference in the control unit CU and the third and fourth circular counters C3, C4 are provided for recognizing a phase difference. Proceeding from the identified frequency and phase differences between reference and output clock signal rs, es, control signals ss for controlling the switchover unit MUX as well as division control command stb for adaptation of the division ratio of the second, switchable frequency divider unit T2 are formed in the control unit CU and are forwarded to the multiplexer unit MUX or to the second switchable frequency divider unit T2. With the assistance of the communicated control signals ss, the switchover unit MUX regulates the ring oscillator frequency, and an output clock signal es corrected in view of the frequency is acquired. The corrected output clock signal es is in turn supplied to the output E of the digital phase locked loop DPLL as well as to the second switchable frequency divider unit T2 and is thus resupplied to the control circuit.

Figure 2:
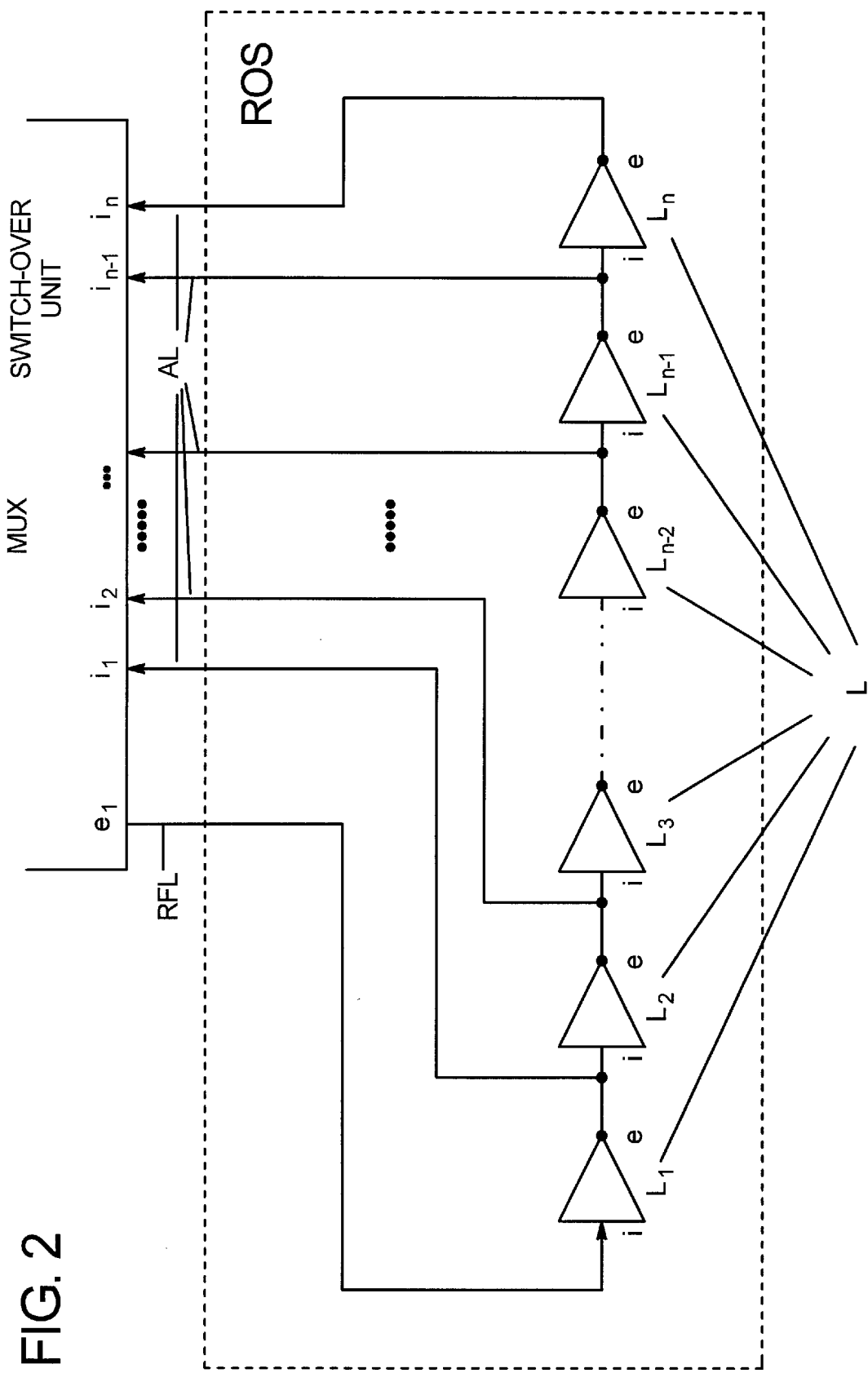
FIG. 2 shows a block circuit diagram of a ring oscillator provided for the realization of the, digital phase locked loop of the invention.

For further explanation of the invention, FIG. 2 schematically shows the structure of the ring oscillator ROS already shown in FIG. 1. The ring oscillator ROS is composed of a plurality of serially arranged delay units $L_1$ through $L_n$, whereby the delay units $L_1$ through $L_n$ can be realized both as delay elements as well as inverters. In the exemplary embodiment shown in FIG. 2, a first through $n^{th}$ inverter $L_1$ through $L_n$ is shown, whereby the inverters $L_1$ through $L_n$ are series-connected and each inverter $L_1$ through $L_n$ respectively comprises an input i and an output e. The return of the ring oscillator ROS occurs via the switchover unit MUX of the digital phase locked loop DPLL. For this purpose, the output e of the first through $n^{th}$ inverter $L_1$ through $L_n$ is respectively connected to an input $i_1$ through $i_n$ of the switchover unit MUX, and the feed back circuit required for generating an oscillation is closed via the return line RFL connected to the first output el of the switchover unit MUX. The return of the ring oscillator ROS is designed with the assistance of the switchover unit MUX, so that the ring oscillator frequency can be modified by cut-in or cut-out of, for example, inverters $L_1$ through $L_n$. Further, the output clock signal es present at the outputs e of the respective inverters $L_1$ through $L_n$ given a closed circuit comprises different phase positions that can be utilized for the correction of the phase difference between reference signal rs and output clock signal es. The control unit CU shown in FIG. 1 is provided for the control of the phase locked loop DPLL, whereby the control can be divided here into two "phases"— the "rough" and the "fine" control of the phase locked loop DPLL. Upon initialization of the phase locked loop DPLL, the transient response of the digital phase locked loop or of the ring oscillator is first implemented by the control unit CU with the assistance of a control signal ss communicated to the switchover unit MUX. Thus an arbitrarily defined number of inverters $L_1$ through $L_n$ are connected through by the control signal with the assistance of the switchover unit MUX and, thus, a first output signal es1 with a stable frequency is generated. After the presence of this first output signal es1 at the third output $e_3$ of the switchover unit MUX, the frequency of the first output signal es1 is matched by the second frequency divider unit T2 to the operating frequency range of the phase comparator PV. Subsequently, the divided, first output signal es1' and the divided reference signal rs' are compared in the phase comparator PV. The first and second counters C1, C2, for example digital down counters, provided in the control unit CU are started by a signal edge of the reference signal. Thus the first counter C1 exhibits a first, whole-number start value N1 and the second counter C2 exhibits a second whole-number start value N2, a relationship of NI and N2 to one another being defined by a frequency difference of the reference signal to the output clock signal that is to be regulated or that is demanded. Based on the sequence of the run-down of the first and second counters C1, C2, the control unit CU provides a first control signal ss1 that is transmitted to the switchover unit MUX and effects via the switch-over unit MUX a cut-in or cut-out of one or more delay elements or, respectively, inverters $L_n$ within the ring oscillator ROS. As a result thereof, the frequency of the output clock signal es is "roughly" regulated, i.e. it can be approximated to the frequency of the reference signal rs to such an extent after repeated control passes until the plurality of delay units or inverters L of the ring oscillator ROS is precisely defined to one or two neighboring values for generating the reference frequency.

Following the "rough" regulation of th e frequency of the output clock signal es, the "fine" regulation is implemented with the assistance of the second switchable frequency divider unit T2 and with the assistance of the third and fourth circular counters C3, C4 provided in the control unit CU. For this purpose, the first and second divider counters ca, cb provided in the second switchable frequency divider unit T2 are respectively initialized with a start value. The counter reading of the first divider counter ca determines the plurality of clock periods wherein an output clock signal es exhibiting a first frequency is present and the counter reading of the second divider counter cb determines the number of the following clock periods wherein an output clock signal es exhibiting a second neighboring frequency is present. With the assistance of the counter readings of the first and second divider counters ca, cb, the control unit CU thus determines a relationship (a switching relationship) for the switching between two inputs $i_1$ through $i_n$ of the switchover unit MUX for generating an output clock signal es exhibiting an intermediate frequency that is communicated to the switchover unit with the assistance of first control signals ss1. For example, a control bus (not shown in FIG. 1) can be provided for communicating the different control signals ss, ss1 from the control unit CU to the switchover unit MUX.

Further, the third and fourth circular counters C3, C4 provided i n the control unit are utilized for the "fine" regulation, whereby the third counter C3 is started once with a third whole-number start value N3 and the fourth counter C4 is started once with a fourth whole-number start value N4, respectively by a signal edge of the reference signal rs, and in turn automatically re-load the original third or fourth start value N3, N4 after a complete run. Further, the ratio of the third to the fourth start value N3/N4 is predetermined by the required ratio of the reference signal rs to the output clock es. For "fine" regulation, the counter reading of the third counter C3 is respectively diminished or "counted down" by one count unit by a signal edge of the divided reference signal rs' adjacent at the phase comparator PV and the counter reading of the fourth counter C4 is respectively reduced or "counted down" by one count unit by a signal edge of the divided output clock signal es' adjacent at the phase comparator PV, and the counter reading of the third counter C3 is compared to that of the fourth counter C4 at the zero axis crossing of the fourth counter C4, i.e. the "migration direction" of the zero axis crossing of, for example, the fourth counter C4 in view of the counter reading of the third counter C3 provides information as to whether the phase of the output clock signal es must be reduced or raised in order to approximate the frequency of the output clock signal es to the frequency of the reference signal rs. The counter reading of first and/or second divider counters Ca, Cb is thus raised or lowered on the basis of the comparison result. As a result thereof, the frequency of the ring oscillator ROS or of the output clock signal es can be raised in that the counter reading of the first divider counter Ca is reduced or the counter reading of the second divider counter Cb is raised, assuming that the first divider counter Ca represents clock periods wherein an output clock signal es exhibiting a first frequency is present and the second divider counter Cb represents clock periods wherein an output clock signal es exhibiting a second, higher frequency compared to the first is present. Analogous thereto, the frequency of the ring oscillator ROS or of the output clock signal es can be lowered in that the counter reading of the first divider counter Ca is raised or the counter reading of the second divider counter Cb is lowered. This "tuning" of the first and second divider counters Ca, Cb occurs based on the "Bresenham" algorithm known from computer graphics.

Figure 3:
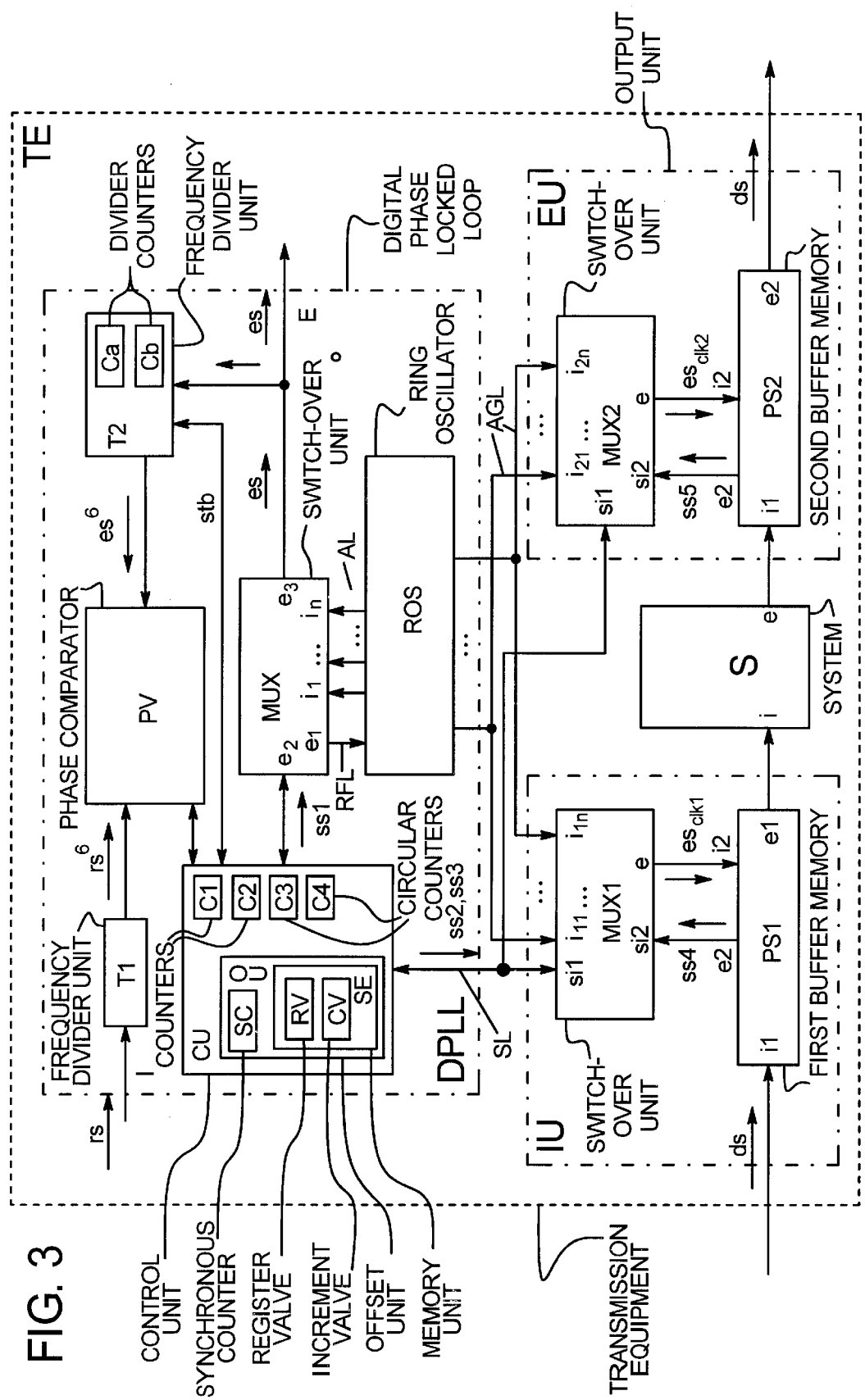
FIG. 3 shows a block circuit diagram with the employment of the digital phase locked loop of the invention for clock recovery for an input and output unit.

In a block circuit diagram, FIG. 3 shows the employment of the inventive digital phase locked loop DPLL for clock recovery in an input unit IU and an output unit EU of a transmission equipment TE. To this end, the digital phase locked loop DPLL provided in the transmission equipment TE is connected via control lines SL to an input unit IU and to an output unit EU, whereby the data or data stream ds transmitted to the transmission equipment TE is initially processed in the input unit IU and is subsequently forwarded to the output unit EU via the system s that represents the core of the transmission equipment TE and comprises an input i and an output e. The data or the data stream ds are further-processed in the output unit EU and are communicated to further transmission equipment TE.

For this purpose, the input unit IU comprises a first, further switchover unit MUX1 and the second output EU comprises a second, further switchover unit MUX2 that are respectively connected via phase connection lines AGL to the ring oscillator ROS of the digital phase locked loop DPLL. Further, the first, further switchover unit MUX1 is connected to the first buffer memory PSI arranged in the input unit IU, and the second, further switchover unit MUX2 is connected to the second buffer memory PS2 arranged in the output unit EU. The first and second buffer memory PS1, PS2 respectively exhibit a first and second input $i_1$, $i_2$ and a first and second output e1, e2. The first and second switchover units MUX 1, MUX 2 respectively comprises first through $n^{th}$ inputs $i_{11}$ through $i_{1n}$, $i_{21}$ through $i_{2n}$, a first and second control input si1, si2 and an output e. In particular, the first through $n^{th}$ inputs $i_{11}$ through $i_{1n}$, $i_{21}$ through $i_{2n}$ of the first and second switchover units MUX1, MUX2 are connected via the phase connection lines AGL to the ring oscillator ROS via which output clock signal es having different phase position and frequency compared to the reference signal rs can be taken from the ring oscillator ROS.

The data stream ds is conducted to the first input i1 of the first buffer memory PS1, and the first, recovered output clock signal $es_{CLK1}$ generated by the first, further switchover unit MUX 1 is conducted to the second input i2. Further, the first output e1 of the first buffer memory PS1 is connected to the input i of the system S, whereby the second output e2 of the first buffer memory PS1 is connected to the second control input si2 of the first, further switchover unit MUX1.

Analogous thereto, the first or, respectively, second input i1, i2 of the second buffer memory PS2 is connected to the output e of the system S or to the output e of the second, further switchover unit MUX2. Further, the data stream or the data ds to be further-switched is adjacent at the first output e1 of the second buffer memory PS2. The second output e2 of the second buffer memory PS2 is connected to the second control input si2 of the second, further switchover unit MUX2.

For controlling the first and second, further switchover units MUX1, MUX2, the first control input sil of the first and second, further switchover units MUX1, MUX2 is respectively connected via control lines to the digital control unit CU of the digital phase locked loop DPLL.

The data ds incoming at the first input i1 of the first buffer memory PS1 are read into the first buffer memory PSi and the filling level of the first buffer memory PS1 is transmitted to the first, further switchover unit MUX1 with the assistance of a fourth control signal ss4. The clock required for the read-in of the first buffer memory PS1 or the first recovered output clock signals $es_{CLK1}$ is generated by the first, further switchover unit MUX1 and is transmitted to the second input i2 of the first buffer memory PS1. For this purpose, a second control signal ss2 is generated with the assistance of an offset unit OU arranged in the control unit CU.

The offset unit OU comprises a memory unit SE and a synchronous counter SC, whereby a register value RV and an increment value CV are stored in the memory unit SE. The synchronous counter SC is clocked by the reference signal rs or is "counted up" by a count step with each signal edge of the reference signal and is reset after the maximum counter reading has been reached. The second control signal ss2 is stored in the memory unit SE in the form of the register value RV that is composed of a multi-bit value. With the assistance of the register value RV, which is transmitted via the control lines SL to the first, further switchover unit MUX1, the first, further switchover unit MUX1 determines the phase position or frequency of the first recovered output clock signal $es_{CLK1}$ transmitted to the first buffer memory PS1. When the register value RV remains unmodified, then the first recovered output clock signal $es_{CLK1}$ present at the input e of the first further switchover unit MUX1 retains its frequency, i.e. the incoming data ds are read into the first buffer memory PS1 with a clock that nearly corresponds to the frequency of the reference signal.

The increment value CV stored in the memory unit SE is provided for generating a first recovered output clock signal $es_{CLK1}$ exhibiting an offset with respect to the reference signal rs, the synchronous counter SC being respectively deincremented or incremented cyclically with the assistance of said increment value CV by the amount of the increment value CV. The counter reading of the synchronous counter SC that is thereby cyclically obtained is stored as current register value RV or the old register value RV is overwritten with the counter reading of the synchronous counter SC. The synchronous counter SC is thus periodically raised or lowered by the increment value CV, as a result whereof a first recovered output clock signal $es_{CLK1}$ having a lower or higher frequency compared to the ring oscillator frequency is generated at the output e of the first further switchover unit MUX1.

The size of the offset of the increment value CV is dependent, among other things, on which filling level the first buffer memory PS1 exhibits. The filling condition of the first buffer memory PS1 is indicated to the first, further switchover unit MUX1 and, thus, to the control unit CU via the fourth control signal ss4 and is taken into consideration in the formation of the increment value CV in the control unit CU.

Analogous thereto, a stable clock exhibiting an offset with respect to the frequency of the reference signal rs or a second recovered output clock signal $es_{CLK2}$ is required upon output of the data ds onto the transmission link, i.e. for the readout of the data ds from the second buffer memory PS2 of the output unit EU. This second recovered output clock signal $es_{CLK2}$ is generated with the assistance of the second, further switchover unit MUX2. The filling level of the second buffer memory PS2 is thereby transmitted with a fifth control signal ss5 to the second further switchover unit PS2, this being also considered in the control unit CU in the formation of the increment value CV. The data ds incoming from the system S at the first input i1 of the second buffer memory PS2 are read into the second buffer memory PS2. Further, the second, further switchover unit MUX2 is controlled with the assistance of a third control signal ss3 with the assistance of the offset unit OU, analogous to the control of the clock recovery in the input unit IU. The data ds stored in the second buffer memory PS2 are read out on the basis of the "offset", second recovered output clock signal $es_{CLK2}$ that derives at the output e of the second, further switchover unit MUX2.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A transmission equipment, comprising:
   a digital phase locked loop for controlling frequency and phase of an output clock signal dependent on a reference signal;
   the digital phase locked loop comprising a ring oscillator connected to a switch-over unit for generating the output clock signal, said ring oscillator comprising a plurality of serially arranged delay units;
   a phase comparator for comparing a phase of the reference signal and of the output clock signal;
   at least one switchable frequency divider unit connected between an output of the switch-over unit and the phase comparator; and
   a control unit for controlling a frequency of the ring oscillator by regularly switching between outputs of neighboring delay units of the ring oscillator with assistance of the switch-over unit to alter a number of the delay units which are effective within the ring oscillator.

2. The transmission equipment according to claim 1 wherein a further switchover unit is provided for generating a recovered output clock signal with a slightly different phase position and frequency compared to the output clock signal by a continuous, cyclical taking of the signals that are present at the outputs of the delay units of the ring oscillator and which respectively exhibit a different phase.

3. The transmission equipment digital phase locked loop according to claim 1 wherein the switchable frequency divider unit is inserted between the switch-over unit and the phase comparator so that output clock signals with different frequencies are generated given an unmodified reference signal.

4. The transmission equipment digital phase locked loop according to claim 1 wherein the switchover unit is a multiplexer.

5. The transmission equipment digital phase locked loop according to claim 1 wherein the delay units each comprise at least one of inverters and delay elements.

6. The transmission equipment digital phase locked loop according to claim 1 wherein the frequency divider unit comprises first and second divider counters whereby a counter reading of the first divider counter determines a number of clock periods wherein an output clock signal exhibiting a first frequency is present, and a counter reading of the second divider counter determines a number of corresponding clock periods wherein a second output clock signal exhibiting a second neighboring frequency is present; and an output clock signal having a frequency lying between a first and a second neighboring frequency is generated on the basis of the counter readings of the first and second divider counters.

7. The transmission equipment digital phase locked loop according to claim 6 wherein first and second circular counters are provided, whereby the first circular counter is started with a first whole-number start value N1 and the second circular counter is started with a second whole-number start value N2, the respective first and second circular counters being started by a signal edge of the reference signal;
   a ratio of the first to the second start value N1/N2 is determined by a required relationship of the reference signal to the output clock signal; and
   a first control signal for cut-in or cut-out of delay units within the ring oscillator is generated by the control unit on the basis of a sequence of a run-down of the first and second circular counters.

8. The transmission equipment digital phase locked loop according to claim 7 wherein third and fourth circular counters are provided, whereby the third circular counter is started with a third whole-number start value N3 and the fourth circular counter is started by a fourth whole-number start value N4, the third and fourth circular counters being respectively started by a signal edge of the reference signal, and a counter reading of the third circular counter is respectively reduced by a count unit with a clock edge of a divided reference signal and a counter reading of the fourth circular counter is respectively reduced by a count unit with a clock edge of a divided output clock signal;

- a ratio of the third and fourth start value N3/N4 is determined by a required relationship of the reference signal to the output clock signal;
- the counter reading of the third and fourth circular counters being compared at a zero axis crossing of one of the third and fourth counters; and
- based on a result of the comparison, a counter reading of one of the first and second divider counters is raised or lowered.

9. The transmission equipment digital phase locked loop according to claim 1 wherein a most recently generated form of said output clock signal continues to be generated given outage of the reference signal.

10. The transmission equipment according to claim 1 wherein a recovered output clock signal having a defined clock phase and frequency is respectively through-connected by a further switchover unit with assistance of a second control signal generated by the control unit;

the second control signal is represented by a register value that is formed by a synchronous counter clocked by the reference signal; and the synchronous counter is respectively incremented or deincremented by a predetermined, whole-number increment value for raising or lowering a clock phase and frequency of the recovered output clock signal.

11. The digital phase locked loop according to claim 10 wherein a predetermined whole-number increment value is provided for offset formation between the reference signal and the recovered output clock signal.

12. The digital phase locked loop according to claim 1 wherein a plurality of further switchover units are provided for generating a plurality of recovered output clock signals exhibiting a differently slight frequency offset with respect to the reference signal.

13. A digital phase locked loop for controlling frequency and phase of an output clock signal dependent on a reference signal comprising:

- a ring oscillator connected to a switch-over unit for generating the output clock signal, said ring oscillator comprising a plurality of delay units;
- a phase comparator for comparing a phase of the reference signal and of the output clock signal;
- at least one switchable frequency divider unit; and
- a control unit for controlling a frequency of the ring oscillator by regularly switching between outputs of neighboring delay units of the ring oscillator with assistance of the switch-over unit to alter a number of the delay units which are effective within the ring oscillator.

* * * * *